US009287604B1

(12) United States Patent
Noujeim

(10) Patent No.: US 9,287,604 B1
(45) Date of Patent: Mar. 15, 2016

(54) FREQUENCY-SCALABLE TRANSITION FOR DISSIMILAR MEDIA

(75) Inventor: Karam M. Noujeim, Los Altos, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 827 days.

(21) Appl. No.: 13/525,091

(22) Filed: Jun. 15, 2012

(51) Int. Cl.
*G01R 27/28* (2006.01)
*H01P 5/08* (2006.01)

(52) U.S. Cl.
CPC . *H01P 5/085* (2013.01); *H01P 5/08* (2013.01)

(58) Field of Classification Search
CPC .................................. H01P 5/085; H01P 5/08
USPC .................................................. 333/33, 260
See application file for complete search history.

(56) References Cited

FOREIGN PATENT DOCUMENTS

WO WO 2004017516 A1 * 2/2004 .............. H03H 7/38

OTHER PUBLICATIONS

Holzman, Essentials of RF and Microwave Grounding, Chapter 4, Transmission Line Transitions, pp. 85-114, Artech House, Inc., 2006.*

* cited by examiner

*Primary Examiner* — Daniel Miller
(74) *Attorney, Agent, or Firm* — Tucker Ellis LLP

(57) ABSTRACT

A frequency-scalable device for interfacing a planar medium with a coaxial medium to propagate a primary signal, the device comprises a transition medium connectable between the coaxial medium and the planar medium. The transition medium suppresses excitation of secondary electrical signals by the primary signal when the primary signal is propagated through the transition medium at a frequency below an upper limit.

17 Claims, 5 Drawing Sheets

FREQUENCY-SCALABLE TRANSITION FOR DISSIMILAR MEDIA

TECHNICAL FIELD

The present invention relates generally to devices and methods for interfacing dissimilar media for propagating electromagnetic signals.

BACKGROUND OF THE INVENTION

Reflections at the interfaces between dissimilar signal propagation media used within measurement systems increase rapidly with frequency. These reflections are undesirable as they reduce the raw directivity of directional-coupler-based systems such as vector network analyzers (VNA) and other reflectometer-based instruments. A significant source of reflection (and thus reduced raw directivity) is the interface between a measurement system (i.e. VNA), which commonly includes semiconductor circuitry in planar or monolithic format, and a propagation medium connecting the measurement system to a load or device under test (DUT). Maintaining high raw directivity with increasing frequency can be difficult. For example, existing techniques for interfacing a reflectometer with a coaxial section exhibit standing waves across the interface that make this interface unusable at high frequencies (e.g., frequencies that exceed 70 GHz). There is thus a need for methods and devices for interfacing dissimilar propagation media in a low-reflection manner so as to maintain raw coupler directivity when propagating high frequency signals.

BRIEF DESCRIPTION OF THE DRAWINGS

Further details of embodiments of the present invention are explained with the help of the attached drawings in which.

SUMMARY

Figure 1:
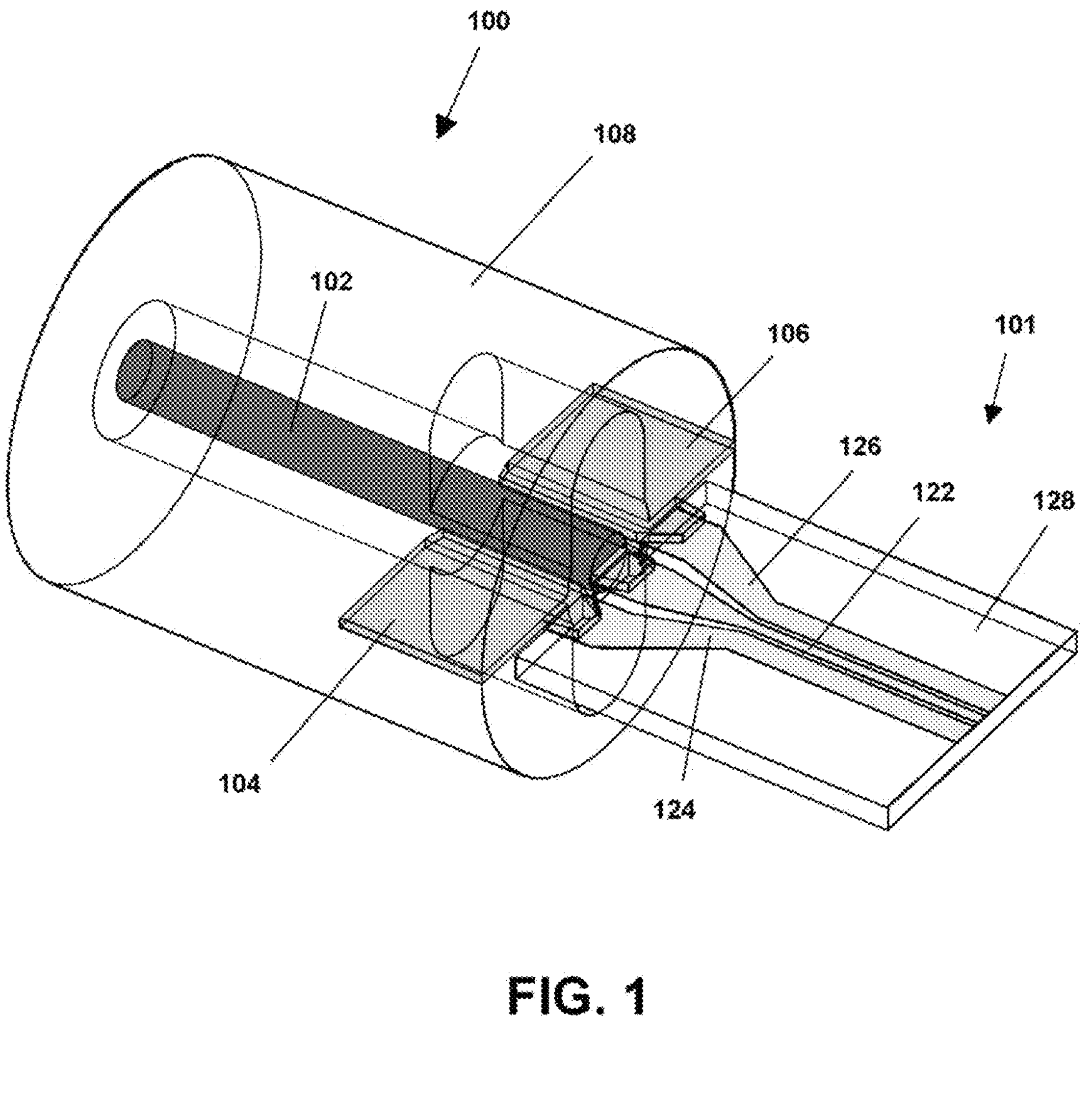
FIG. 1 is a perspective view of an embodiment of a coplanar-waveguide-to-coax transition in accordance with the present invention.

In accordance with an embodiment of the invention, a frequency-scalable device for interfacing a planar medium with a coaxial medium to propagate a primary signal comprises a transition medium connectable between the coaxial medium and the planar medium. The transition medium suppresses excitation of secondary electrical signals by the primary signal when the primary signal is propagated through the transition medium at a frequency below an upper limit. In some embodiments of the invention, the planar medium is one of a co-planar waveguide and a microstrip.

In some embodiments of the invention, the transition medium further includes a center conductor electrically connectable with a core of the coaxial medium, and a pair of planar conductors extending along at least a portion of the center conductor and electrically connectable with a conductive shield of the coaxial medium. A first stage of the transition medium includes a first portion of the center conductor extending through free space and having a circular cross-sectional shape substantially matched to the core. A second stage of the transition medium includes a second portion of the center conductor extending through free space to the planar medium and having a rectangular cross-sectional shape with a height approximately matched to a cross-sectional height of the planar conductors.

In some embodiments of the invention, the upper limit of the frequency of the primary signal is determined based on a length of the second stage of the transition medium that extends through free space. The upper limit of the frequency of the primary signal is an inverse of a length of the second stage of the transition medium that extends through free space. In some embodiments of the invention, the first stage of the transition medium includes an elliptically-shaped cavity through which the center conductor extends.

In some embodiments of the invention, a reflectometer is connectible with the planar medium to send the primary signal to the coaxial medium and receive incident signals from the coaxial medium. The reflectometer can be a vector network analyzer (VNA).

In some embodiments of the invention, a frequency-scalable device for interfacing a planar medium with a coaxial medium to propagate a primary signal comprises a transition medium connectable between the coaxial medium and the planar medium to form a signal path. In some embodiments, an electric field distribution along the signal path is substantially maintained between the coaxial medium, the transition medium, and the planar medium when the primary signal is propagated at a frequency below an upper limit. In some embodiments, the transition medium is a low reflectance interface adapted to maintain physical directivity of the primary signal when the primary signal is propagated at a frequency below an upper limit.

In some embodiment of the invention, a vector network analyzer for measuring signal response comprises a coax test port, semiconductor circuitry for generating a primary signal and receiving response signals, and a frequency-scalable device for interfacing the semiconductor circuitry with a coaxial medium associated with the coax test port to propagate the primary signal. The device includes a transition medium connectable between the coaxial medium and the semiconductor circuitry. The transition medium suppresses excitation of secondary electrical signals by the primary signal when the primary signal is propagated through the transition medium at a frequency below an upper limit.

In some embodiment of the invention, a method of measuring a signal response of a DUT comprises electrically connecting the DUT to a coax test port of a measurement system. The measurement system can include a transition medium for propagating a signal from a coax medium to a planar medium with low reflection. A signal is generated using the measurement system, and a response of the DUT to the generated signal is measured.

DETAILED DESCRIPTION OF THE DRAWINGS

Embodiments of methods and devices in accordance with the present invention can be applied to interface dissimilar media while maintaining high directivity. Directivity as used in this description refers to the ability of a directional based device to separate incident and reflected waves from a device under test (DUT). Such embodiments achieve high directivity by physically maintaining approximately the same electric field distribution as the signal is propagated from a first medium to a second medium. Electric field distribution can be roughly matched by way of a step-wise transition from the first medium to the second medium, with electric field templates kept roughly matched across each step of the interface and discontinuities kept small relative to the wavelength corresponding to the highest frequency of interest. Maintaining directivity by physically separating incident and reflective waves rather than mathematically separating incident and reflective waves that have both propagated through a medium can improve system stability with reduced complication and cost. One of ordinary skill in the art, upon reflecting on the teachings provided herein, will appreciate that the embodiments described herein can vary in the number of steps over which the transition from the first medium to the second medium occurs and vary in the shapes of structures used to form the transition.

Figure 2:
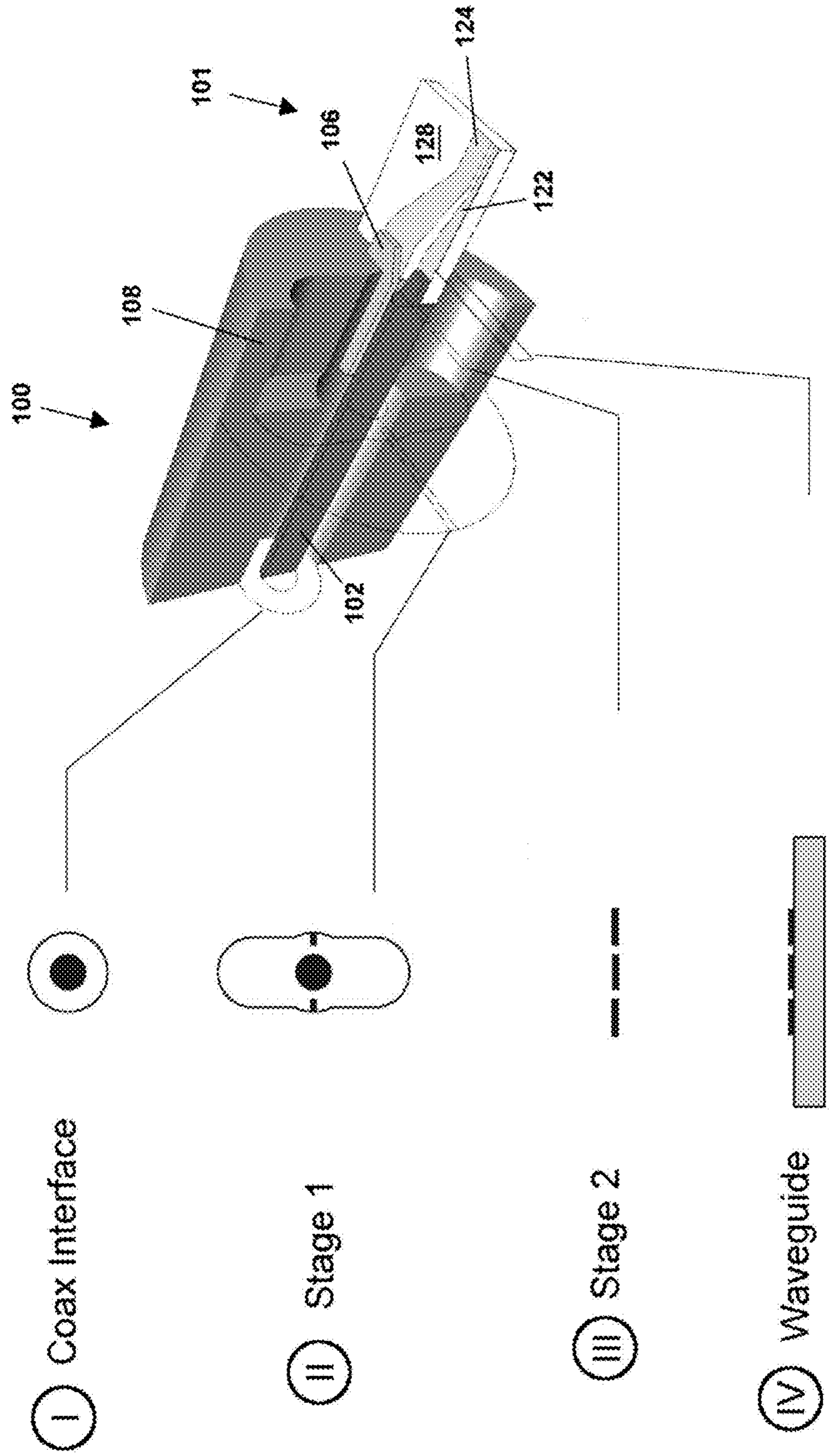
FIG. 2 illustrates a magnetic symmetry plane of the coplanar-waveguide-to-coax transition of FIG. 1.
Figure 3:
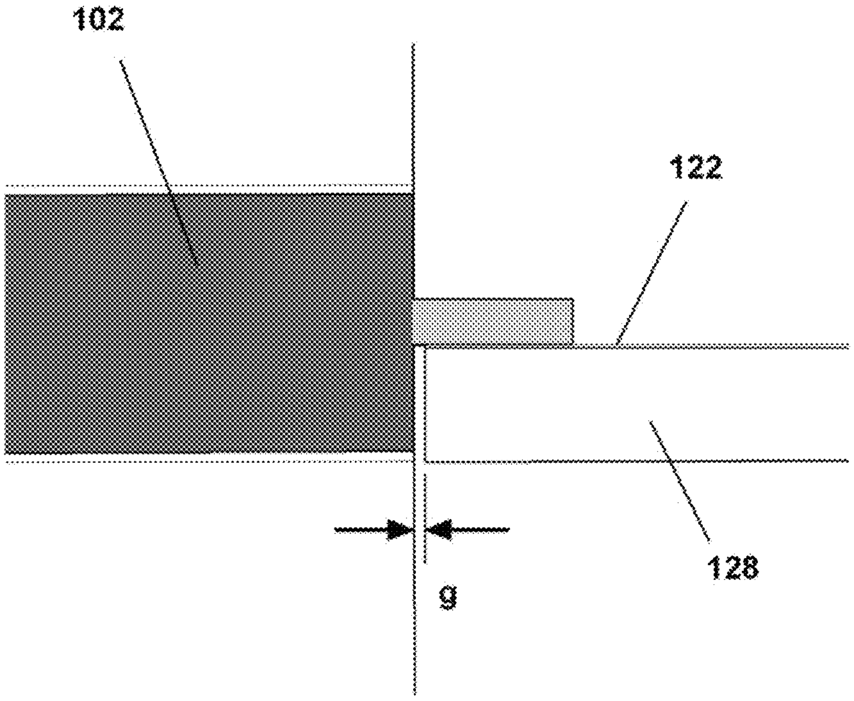
FIG. 3 is a side view of a transition stage of the coplanar-waveguide-to-coax transition of FIG. 1.

FIGS. 1-3 illustrate an embodiment of a device 100 in accordance with the present invention for interfacing a coaxial cable (not shown, also referred to herein as "coax") with a reflectometer. Such a reflectometer can be used, for example, in a vector network analyzer (VNA) to measure DUT performance. The device 100 transitions the propagation medium in stages from a geometry exhibiting an electric field with radial symmetry to a planar geometry. At a distal end, the device 100 comprises a port 108 including a center conductor 102 that interfaces with a core of the coax. A conductive shield of the coax extends into the port 108 and contacts a pair of planar conductors 104, 106. At the proximal end of the device 100, three planar conductors 102, 104, 106 interface with electrical traces 122, 124, 126 of a co-planar waveguide 101. The device 100 propagates high frequency signals between the coax and the co-planar waveguide 101 with low reflection. The co-planar waveguide 101 can then be interfaced with a planar medium of the reflectometer having a roughly similar geometry and dielectric constant to propagate signals to and from semiconductor circuitry of the reflectometer. Because the propagation media of the waveguide 101 and semiconductor circuitry are substantially matched, the waveguide/reflectometer interface can propagate signals with low reflection, and thus maintain the directivity of the directional coupler integrated within the reflectometer.

FIG. 2 illustrates the magnetic symmetry plane of the device 100 of FIG. 1 with cross-sections along the device 100 at changes in the geometry of the propagation medium. From cross-section I to cross-section III, the center conductor 102 of the device 100 is sized and shaped to generally match a core of the coax to which the center conductor 102 is contacted. The co-planar waveguide 101 extends toward the reflectometer (not shown) from cross-section IV. The device 100 includes two transition stages. A first transition stage extends from cross-section II to cross-section III and includes the center conductor 102 extending in free space through a generally elliptical cavity 110. The planar conductors 104, 106 extend along the cavity on opposite sides of the center conductor 102. The electric field is roughly distributed between the respective planar conductors 104, 106 and the center conductor 102, with some of the electric field bending through free space toward the planar conductors 104, 106. A second transition stage extends from cross-section III to cross-section IV, and includes the center conductor 102 and the three planar conductors 102, 104, 106 extending a mode-limiting distance over free space, with the electric field substantially confined and intensified between the respective planar conductors 104, 106 and the center conductor 102. The mode-limiting distance is shown in FIG. 3 as a gap, g, between a substrate 128 of the co-planar waveguide 101 and the point of transition of the center conductor 102 from a geometry generally matched to the core of a coax to a planar geometry approximately matched in height to the planar conductors 104, 106 on either side of the center conductor 102. (In FIGS. 1 and 3, the planar geometries are shown in a medium shade, while the portion of the center conductor 102 matched to the core of the coax is shown in a dark shade.)

The gap, g, between the substrate 128 of the waveguide 101 and the coax-matched geometry of the central conductor 102 physically limits the modes that can populate the propagation medium and is sized such that the gap is a fraction of the wavelength of a signal propagating at an upper operating frequency. Thus, for example, a gap for a device 100 intended for operation in a range of 40 KHz to 100 GHz would have a length smaller than 3 mils (1 mil=0.001 inch).

Embodiments of devices in accordance with the present invention are scalable to accommodate different frequency bands by physically scaling the size of the structures and gap to prevent excitation of undesirable electrical modes and to approximately match the scaling of coax. For example, the central conductor can be sized to match a coax having a core sized at 3.5 mm, which can reliably propagate signals having frequencies ranging from DC to 26.5 GHz without parasitic modes, or a coax having a core sized at 1 mm can reliably propagate signals having frequencies from DC to 110 GHz without parasitic modes.

Figure 4:
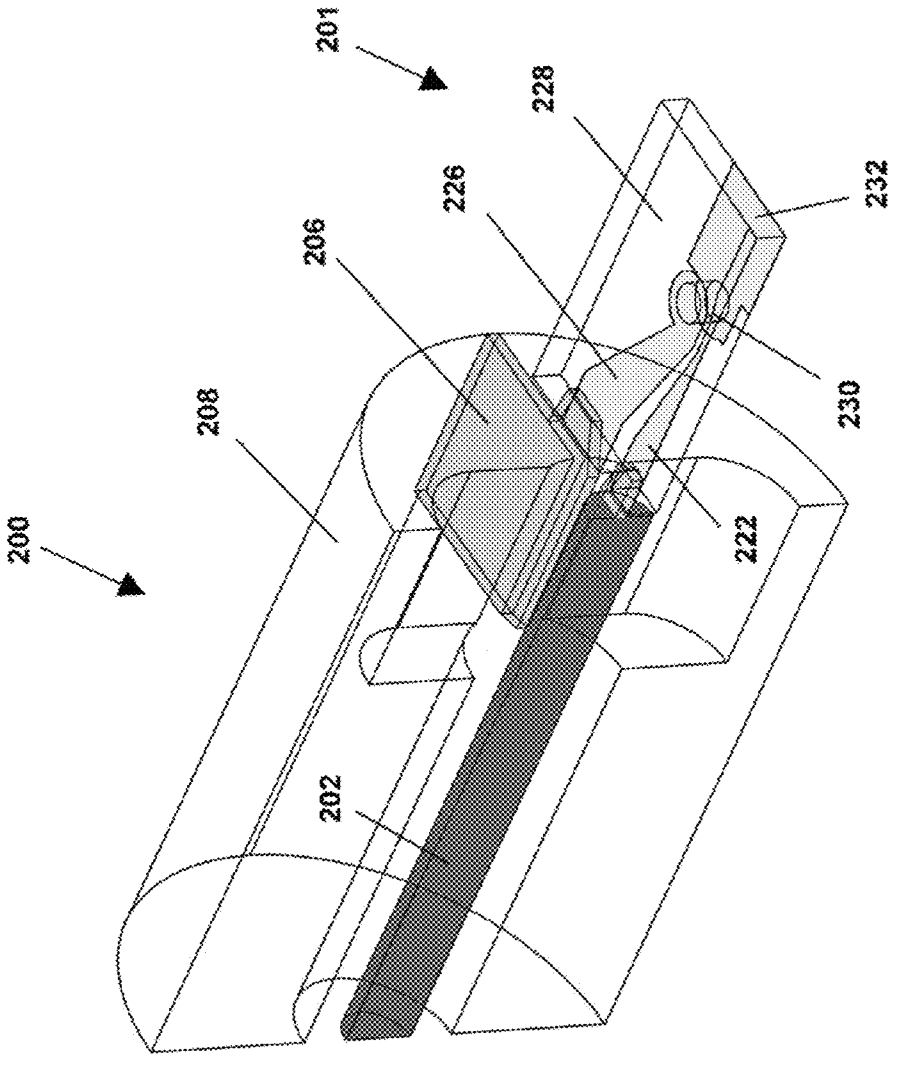
FIG. 4 is a perspective view of an alternative embodiment of a planar-microstrip-to-coax transition in accordance with the present invention.

FIG. 4 is a perspective view of a magnetic symmetry plane of an alternative embodiment of a device 200 in accordance with the present invention for interfacing a coaxial cable to a microstrip 201. The device 200 is substantially the same in structure accept that the planar conductors 202, 206 land on electrical traces 222, 226 of a microstrip 201. The view is mirrored with ground traces 226 on either side of the central trace 222. The ground traces 206 are connected by way of vias 230 extending through the substrate to an opposite side of the substrate, to form a common ground plane 232 separated from the central trace 222 by the thickness of the microstrip 201 substrate 228.

As will be appreciated, the invention is not intended to be limited to the media described herein, as they are merely exemplary. The invention is intended to be directed to interfaces between two dissimilar mediums, particularly where electric field distributions vary.

Figure 5:
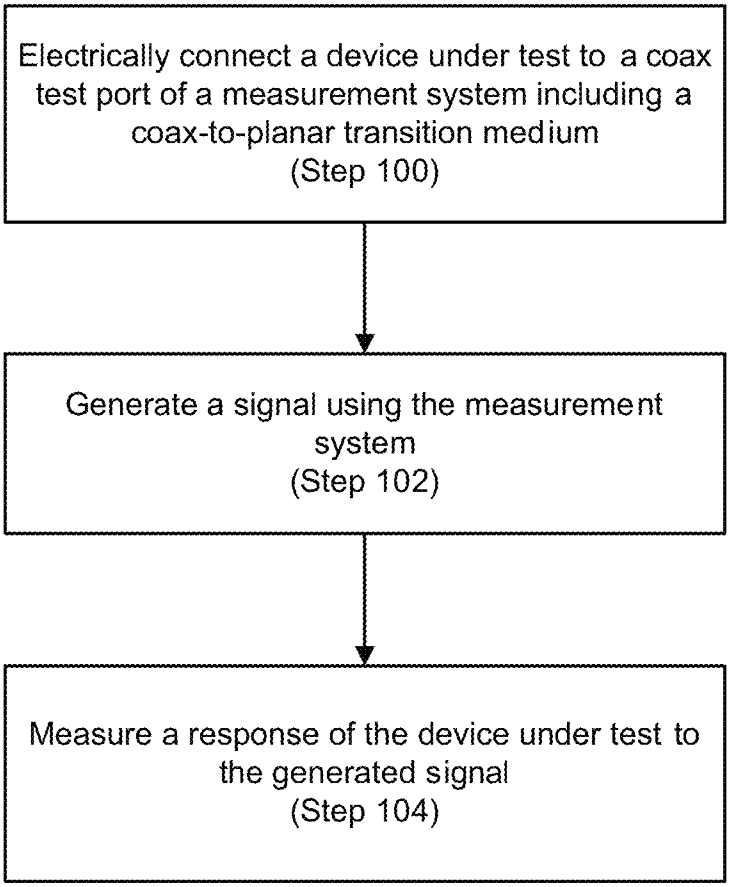
FIG. 5 is a flowchart of an embodiment of a method of measuring a signal response in a device under test in accordance with the present invention.

FIG. 5 is a flowchart of an embodiment of a method of measuring a signal response in a DUT in accordance with the present invention. The DUT is connected with a coax test port of a measurement system (Step 100). The measurement system includes a transition medium for propagating a signal from coax to a planar medium with low reflection. The measurement system can be, for example, a vector network analyzer. A signal is then generating using the measurement system (Step 102) and a response of the DUT to the generated signal is measured (Step 104). The transition medium suppresses excitation of secondary electrical signals by the primary signal when the primary signal is propagated through the transition medium at a frequency below an upper limit. The measurement system can sweep through a range of frequencies to the DUT, for example for passive intermodulation (PIM) sources. The transition medium and/or a device including the transition medium can be included as a component of the measurement system, and can include structures as described above. For example, a vector network analyzer can include a coax test port interfaced with semiconductor circuitry of the vector network analyzer by the transition medium. Alternatively, the transition medium can include different structures ascertained in light of the present specification. Further the transition medium can be included in a device separate from the measurement instrument and electrically connectable between the measurement system and the coax medium.

The foregoing description of the present invention has been presented for purposes of illustration and description. It is not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A transition medium for interfacing a planar medium with a coaxial medium to propagate a primary signal, the transition medium comprising:

a body;

a center conductor extending through the body and electrically connectable with the coaxial medium at a coax interface and the planar medium at a planar interface;

a first cavity extending from the coax interface through a first portion of the body, the first cavity having a substantially circular cross-section, wherein a first portion of the center conductor is arranged substantially coaxially within the first cavity;

a second cavity extending from the first cavity through a second portion of the body, the second cavity extending the first cavity into the body upward and downward relative to the planar medium, wherein a second portion of the center conductor is arranged within the second cavity;

wherein the first portion and the second portion of the center conductor are substantially circular and substantially continuous in cross-section;

a pair of planar conductors substantially coplanar with the center conductor and extending along at least a portion of the second cavity and extending from the second cavity to the planar interface, wherein the pair of planar conductors extend into the second cavity so that a distance from a surface of the second portion of the center conductor to each of the pair of planar conductors is smaller than a distance from a surface of the first portion of the center conductor to a sidewall of the first cavity; and a planar portion of the center conductor extending from the second cavity to the planar interface, wherein the planar portion of the center conductor is substantially coplanar with the pair of planar conductors;

wherein the transition medium suppresses excitation of secondary electrical signals by the primary signal when the primary signal is propagated through the transition medium at a frequency below an upper limit.

2. The transition medium of claim 1, wherein the planar portion of the center conductor extends through free space to the planar medium and includes a height approximately matched to a cross-sectional height of the planar conductors.

3. The transition medium of claim 2, wherein the upper limit of the frequency of the primary signal is determined based on a length of the planar portion of the center conductor that extends through free space.

4. The transition medium of claim 3, wherein the upper limit of the frequency of the primary signal is an inverse of a length of the planar portion of the center conductor that extends through free space.

5. The transition medium of claim 1 wherein the planar medium is one of a co-planar waveguide and a microstrip.

6. The transition medium of claim 1, wherein a reflectometer is connectible with the planar medium to send the primary signal to the coaxial medium and receive incident signals from the coaxial medium.

7. The transition medium of claim 6, wherein the reflectometer is a vector network analyzer (VNA).

8. The transition medium of claim 2, wherein the second cavity is an elliptically shaped cavity through which the second portion of the center conductor extends.

9. A vector network analyzer for measuring signal response comprising:

a coax test port;

semiconductor circuitry for generating a primary signal and receiving response signals; and a transition medium for interfacing the semiconductor circuitry with a coaxial medium associated with the coax test port to propagate the primary signal, the transition medium including a body;

a center conductor extending through the body and electrically connectable with the coaxial medium at a coax interface and the semiconductor circuitry at a planar interface;

a first cavity extending from the coax interface through a first portion of the body, the first cavity having a substantially circular cross-section, wherein a first portion of the center conductor is arranged substantially coaxially within the first cavity;

a second cavity extending from the first cavity through a second portion of the body, the second cavity extending the first cavity into the body upward and downward relative to the semiconductor circuitry, wherein a second portion of the center conductor is arranged within the second cavity;

wherein the first portion and the second portion of the center conductor are substantially circular and substantially continuous in cross-section;

a pair of planar conductors substantially coplanar with the center conductor and extending along at least a portion of the second cavity and extending from the second cavity to the planar interface, wherein the pair of planar conductors extend into the second cavity so that a distance from a surface of the second portion of the center conductor to each of the pair of planar conductors is smaller than a distance from a surface of the first portion of the center conductor to a sidewall of the first cavity; and a planar portion of the center conductor extending from the second cavity to the planar interface, wherein the planar portion of the center conductor is substantially coplanar with the pair of planar conductors;

wherein the transition medium suppresses excitation of secondary electrical signals by the primary signal when the primary signal is propagated through the transition medium at a frequency below an upper limit.

10. The vector network analyzer of claim 9, wherein the transition medium further includes a planar medium comprising one of a coplanar waveguide and a microstrip electrically connectable between the frequency-scalable device at the planar interface, wherein the planar portion of the center conductor extends through free space to the planar medium and includes a height approximately matched to a cross-sectional height of the planar conductors; and wherein the planar medium is electrically connected with the semiconductor circuitry.

11. The vector network analyzer of claim 10, wherein the upper limit of the frequency of the primary signal is determined based on a length of the planar portion of the center conductor that extends through free space.

12. The vector network analyzer of claim 11, wherein the upper limit of the frequency of the primary signal is an inverse of a length of the planar portion of the center conductor that extends through free space.

13. A method of measuring a signal response in a device under test, the method comprising:

electrically connecting the device under test to a coax test port of a measurement system including a coax-to-planar transition medium;

wherein the coax-to-planar transition medium comprises a body, a center conductor extending through the body and electrically connectable with a coaxial medium at a coax interface and a planar medium at a planar interface, a first cavity extending from the coax interface through a first portion of the body, the first cavity having a substantially circular cross-section, wherein a first portion of the center conductor is arranged substantially coaxially within the first cavity, a second cavity extending from the first cavity through a second portion of the body, the second cavity extending the first cavity into the body upward and downward relative to the planar medium, wherein a second portion of the center conductor is arranged within the second cavity, wherein the first portion and the second portion of the center conductor are substantially circular and substantially continuous in cross-section, a pair of planar conductors substantially coplanar with the center conductor and extending along at least a portion of the second cavity and extending from the second cavity to the planar interface, wherein the pair of planar conductors extend into the second cavity so that a distance from a surface of the second portion of the center conductor to each of the pair of planar conductors is smaller than a distance from a surface of the first portion of the center conductor to a sidewall of the first cavity, and a planar portion of the center conductor extending from the second cavity to the planar interface, wherein the planar portion of the center conductor is substantially coplanar with the pair of planar conductors;

generating a signal using the measurement system; and measuring a response of the device under test to the generated signal;

wherein the transition medium suppresses excitation of secondary electrical signals by the primary signal when the primary signal is propagated through the transition medium at a frequency below an upper limit.

14. The method of claim 13, wherein the planar portion of the center conductor extends through free space to the planar medium and includes a height approximately matched to a cross-sectional height of the planar conductors.

15. The method of claim 13, wherein the upper limit of the frequency of the primary signal is determined based on a length of the planar portion of the center conductor that extends through free space.

16. The method of claim 15, wherein the upper limit of the frequency of the primary signal is an inverse of a length of the planar portion of the center conductor that extends through free space.

17. The method of claim 13, wherein the measurement system is a vector network analyzer (VNA).

* * * * *